(12) United States Patent
Hansel et al.

(10) Patent No.: US 6,867,137 B2
(45) Date of Patent: Mar. 15, 2005

(54) FABRICATION METHOD FOR A SEMICONDUCTOR STRUCTURE HAVING A PARTLY FILLED TRENCH

(75) Inventors: Jana Hansel, Dresden (DE); Matthias Rudolph, Dresden (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/660,091

(22) Filed: Sep. 10, 2003

(65) Prior Publication Data

US 2004/0082142 A1 Apr. 29, 2004

(30) Foreign Application Priority Data

Sep. 13, 2002 (DE) .......................................... 102 42 629

(51) Int. Cl.⁷ ..................... H01L 21/302; H01L 21/461; H01L 21/76
(52) U.S. Cl. ...................... 438/689; 438/710; 438/714; 438/424
(58) Field of Search ................................ 438/689, 424, 438/709, 710, 714, 719, 726, 732

(56) References Cited

U.S. PATENT DOCUMENTS

| | | | | |
|---|---|---|---|---|
| 4,766,090 A | * | 8/1988 | Coquin et al. | 438/222 |
| 5,175,122 A | * | 12/1992 | Wang et al. | 438/427 |
| 5,968,842 A | * | 10/1999 | Hsiao | 438/692 |
| 6,074,954 A | * | 6/2000 | Lill et al. | 438/710 |
| 6,284,665 B1 | * | 9/2001 | Lill et al. | 438/710 |
| 6,509,607 B1 | * | 1/2003 | Jerred | 257/330 |
| 6,566,229 B2 | * | 5/2003 | Hong et al. | 438/435 |
| 6,635,573 B2 | * | 10/2003 | Pau et al. | 438/689 |
| 6,638,853 B1 | * | 10/2003 | Sue et al. | 438/633 |
| 6,645,851 B1 | * | 11/2003 | Ho et al. | 438/626 |
| 6,649,515 B2 | * | 11/2003 | Moon et al. | 438/637 |
| 6,713,385 B1 | * | 3/2004 | Pipes et al. | 438/637 |
| 6,764,810 B2 | * | 7/2004 | Ma et al. | 430/313 |
| 2002/0066884 A1 | | 6/2002 | Tsai et al. | 252/79.1 |

* cited by examiner

Primary Examiner—John F. Niebling
Assistant Examiner—Walter L. Lindsay, Jr.
(74) Attorney, Agent, or Firm—Jenkins, Wilson & Taylor, P.A.

(57) ABSTRACT

The present invention provides a fabrication method for a semiconductor structure having a partly filled trench, having the following steps: provision of a semiconductor structure (1, 5) having a trench (2); filling of the trench (2) with a filling (10) in such a way that the filling (10) projects above a surface (OF) of the semiconductor structure (1, 5) by a first height (h1), the filling (10) covering the trench (2) and the periphery (20) of the trench (2); planarization of the filling (10) in a first etching step in such a way that the filling (10) is essentially planar with the surface (OF) of the semiconductor structure (1, 5); and sinking of the filling (10) in the trench (2) in a second etching step by a predetermined depth (T) proceeding from the surface of the semiconductor structure (1, 5); essentially the same plasma power and the same etchant composition being used for the first and second etching steps.

8 Claims, 4 Drawing Sheets

(PRIOR ART)

(PRIOR ART)

FABRICATION METHOD FOR A SEMICONDUCTOR STRUCTURE HAVING A PARTLY FILLED TRENCH

The present invention relates to a fabrication method for a semiconductor structure having a partly filled trench.

Although applicable in principle to any desired integrated circuits, the present invention and the problem area on which it is based are explained with regard to semiconductor structures in silicon technology.

FIGS. 2a–d show diagrammatic illustrations of successive method stages of a fabrication method for a semiconductor structure having a partly filled trench in order to illustrate the problem area on which the invention is based.

Figure 2A:
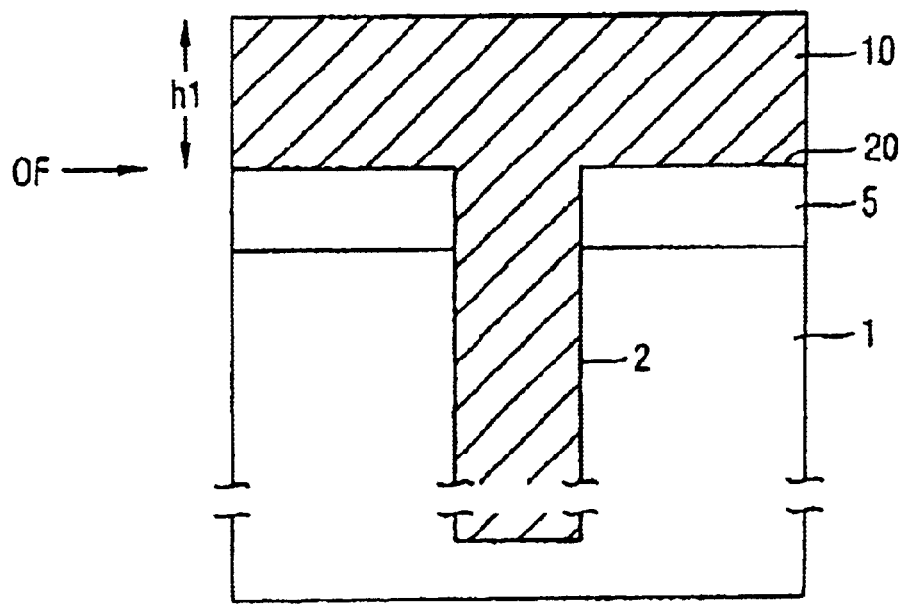

In FIG. 2a, reference symbol 1 designates a silicon semiconductor substrate into which a trench 2 has been etched by means of a hard mask 5. Said trench 2 has been filled with a filling 10 in such a way that the filling 10 projects above a surface OF of the hard mask 5 by a first height h1, the filling 10 projecting both in the region of the trench 2 and in the region of the periphery 20 of the trench 2. Such a filling 10 can be provided by means of a customary CVD deposition process, by way of example.

The following steps are then carried out for the planarization and sinking of the filling 10 in the trench 2, that is to say for the provision of a partly filled trench 2.

Figure 2B:
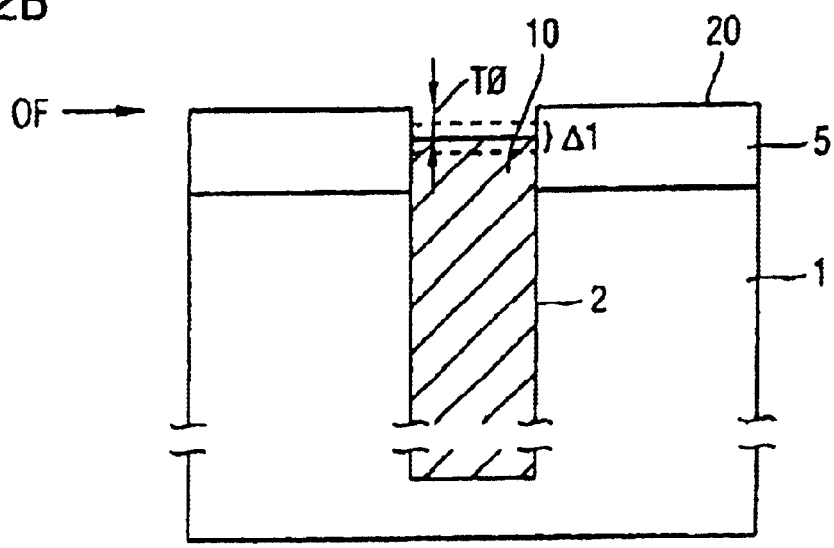
Figure 2C:
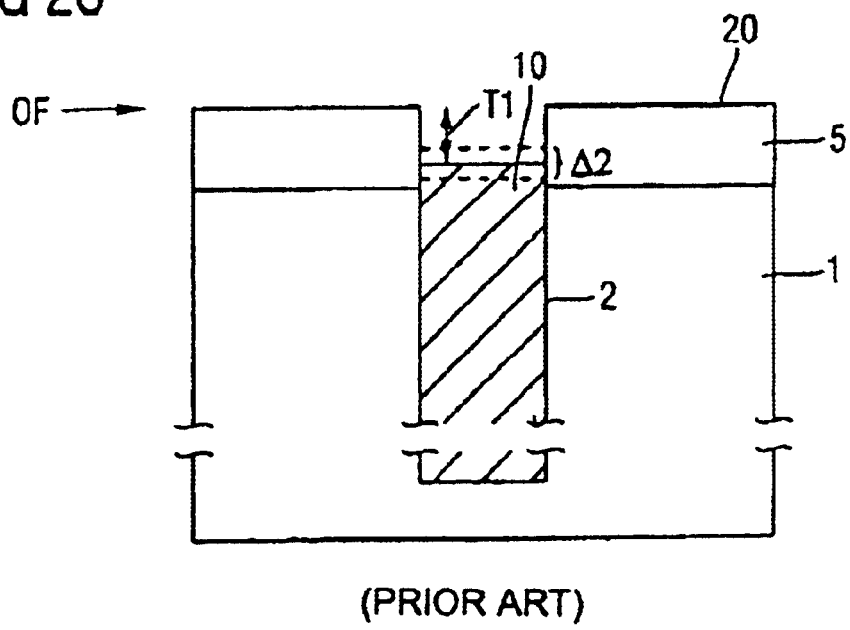

As illustrated in FIG. 2b, firstly a first plasma etching step is carried out using an etchant composition comprising $SF_6/Ar/Cl_2$, a high plasma power being applied, which has the effect that this first etching step proceeds at a relatively high etching rate. The reaching of the surface OF of the hard mask 5 is detected by an optical end point identification, although the latter has a certain delay, so that, in the event of the actual end point identification, the filling 10 has already sunk by a depth T0 in the trench 2. In particular, said depth To has a specific fluctuation range $\Delta 1$.

With the triggering of the end point identification, the etchant composition in the plasma reactor is changed over from $SF_6/Ar/Cl_2$ to $SF_6/Ar$ without interrupting the etching process. The reason for this is that an etchant composition of $SF_6/Ar$ is not expedient in the preceding planarization step since such an etchant composition would have poor uniformity on the large surface OF.

The plasma power is also changed over at the same time as the etchant composition is changed. This has the effect that, during a specific stabilization time period of typically a few seconds, the etching rate and uniformity of the etching process change in a more or less poorly definable manner.

Accordingly, the filling 10 has sunk by a depth T1 with a fluctuation range $\Delta 2$ in the trench 2 before the beginning of the actual sinking step with the stabilized etchant composition.

This in turn has the effect that the start depth T1 for the subsequent sinking step can be determined very imprecisely. Since the sinking step is carried out with a fixedly prescribed time, this means that the final desired sinking depth T likewise varies with a not inconsiderable fluctuation range $\Delta 3$.

The problem area on which the present invention is based consists in providing an improved fabrication method for a semiconductor structure having a partly filled trench which makes it possible to obtain smaller fluctuations in the final sinking depth.

According to the invention, this problem is solved by means of the fabrication method specified in claim 1.

The particular advantages of the fabrication method according to the invention are that the method according to the invention enables the final sinking depth to be established with a very small fluctuation range.

The idea on which the present invention is based consists in the fact that essentially the same gas composition and plasma power are used for the planarization and the subsequent sinking and the stabilization step can be obviated as a result.

Advantageous developments and improvements of the subject matter of the invention are found in the subclaims.

In accordance with one preferred development, a planarization of the filling is carried out in a zeroth etching step before the first etching step in such a way that the filling projects above the surface of the semiconductor structure by a second height, the filling covering the trench and the periphery of the trench, the zeroth etching step having a higher etching rate than the first etching step. This has the advantage that firstly a relatively fast planarization is carried out, the latter being slowed down, however, before the touch-down. This means that the touch-down instant and thus the beginning of the sinking can be detected very reliably and, moreover, the overall process can be accelerated.

In accordance with a further preferred development, essentially the same etchant composition as for the first and second etching steps but an increased plasma power are used for the zeroth etching step.

In accordance with a further preferred development, at least the first etching step is carried out with a first time duration which is determined by an end point identification.

In accordance with a further preferred development, the zeroth etching step and the second etching step are carried out with a predetermined zeroth and second time duration. However, in principle, an end point identification could be employed for these etching steps as well.

In accordance with a further preferred development, the second etching step is carried out with a second time duration which is determined by an end point identification. On account of the defined start depth for the sinking step, the error in the end point determination is also reduced in this step.

In accordance with a further preferred development, the etchant composition contains $SF_6$, Ar and $Cl_2$.

In accordance with a further preferred development, the semiconductor structure comprises a semiconductor substrate and a mask situated thereon, the mask being used for the etching of the trench.

In accordance with a further preferred development, the end point identification is carried out by interferometry.

Exemplary embodiments of the invention are illustrated in the drawings and explained in more detail in the description below.

FIGS. 1a–d show diagrammatic illustrations of successive method stages of a fabrication method for a semiconductor structure having a partly filled trench as an embodiment of the present invention; and FIGS. 2a–d show diagrammatic illustrations of successive method stages of a fabrication method for a semiconductor structure having a partly filled trench in order to illustrate the problem area on which the invention is based.

In FIGS. 1 and 2, identical reference symbols designate identical or functionally identical constituent parts.

Figure 1A:
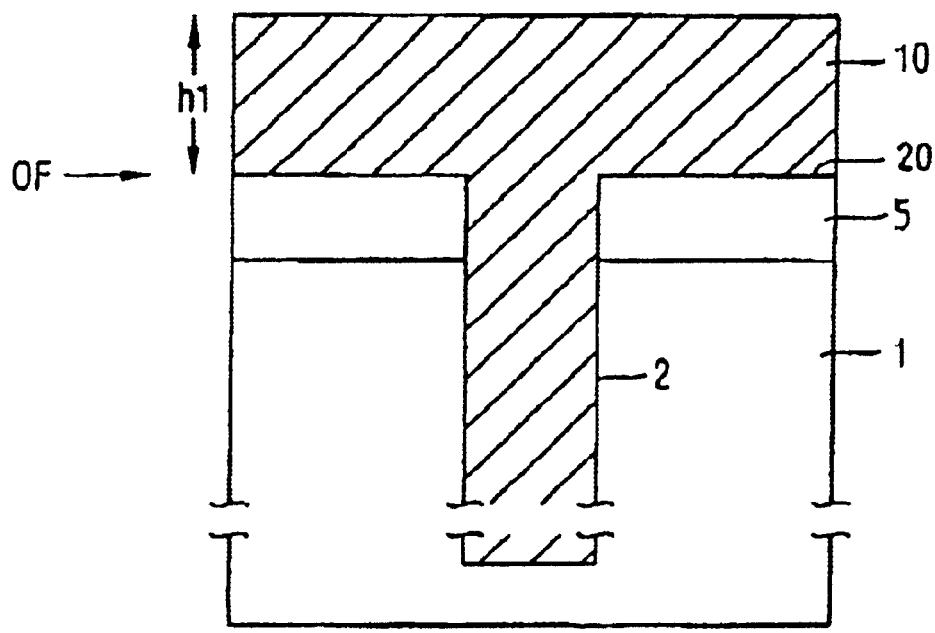

The starting situation in accordance with FIG. 1a is the same as that which has already been explained with reference to FIG. 2a.

Figure 1B:
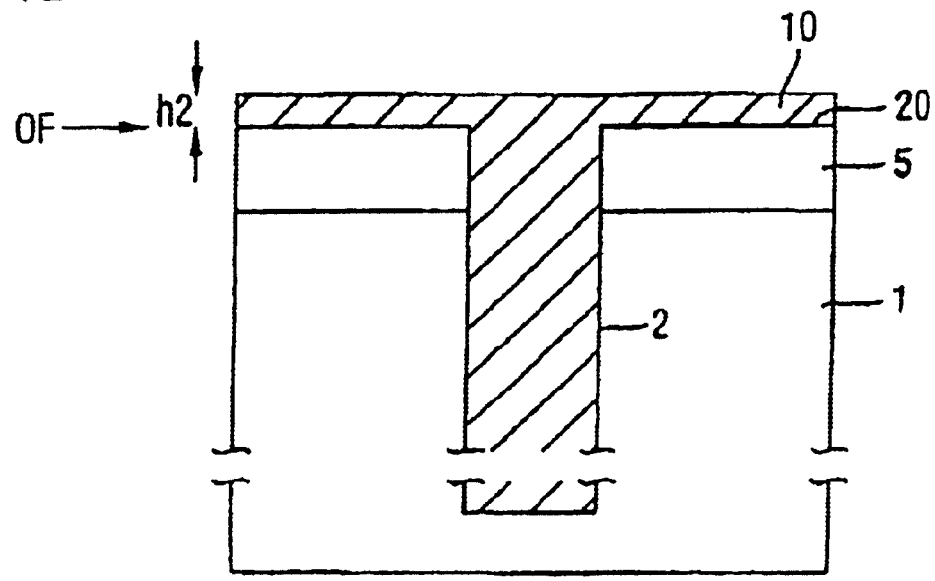
Figure 1C:
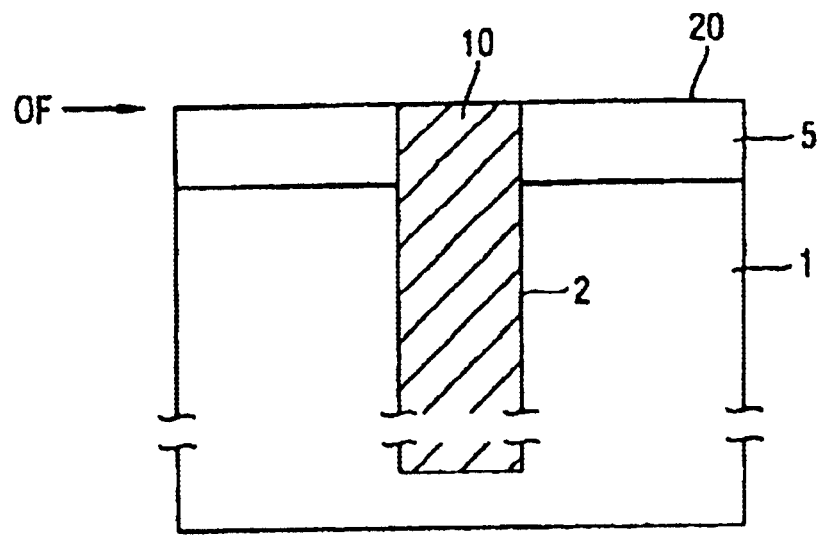

As illustrated in FIG. 1b, a zeroth plasma etching step is then effected for the purpose of planarization using an etchant composition of $SF_6/Ar/Cl_2$ with a high power and a predetermined time, which step brings about planarization of the filling 10 in such a way that the filling 10 projects above the surface OF of the hard mask 5 by a second height h2. In this case, the filling 10 still covers the trench 2 and the periphery 20 of the trench 2.

After this predetermined time in this example, the etchant composition is not altered or is only altered to an insignificant extent, but the plasma power is significantly reduced, which entails a reduction of the etching rate. Afterward, etching is effected at a reduced etching rate until the filling 10 is essentially planar with the surface OF of the hard mask 5. In this case, on account of the reduced etching rate, the end point can be determined relatively precisely by means of an optical end point identification.

Figure 1D:
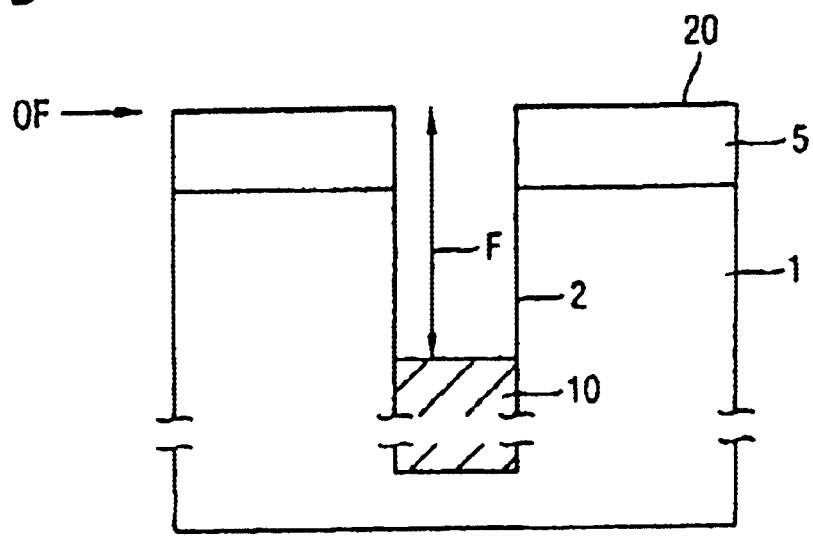

Proceeding from the identified end point, a sinking etching step is carried out with a predetermined time duration and an etchant composition that has not been altered or has been altered to an insignificant extent, in order finally to attain the desired sinking depth T, as is illustrated in FIG. 1d.

Figure 2D:
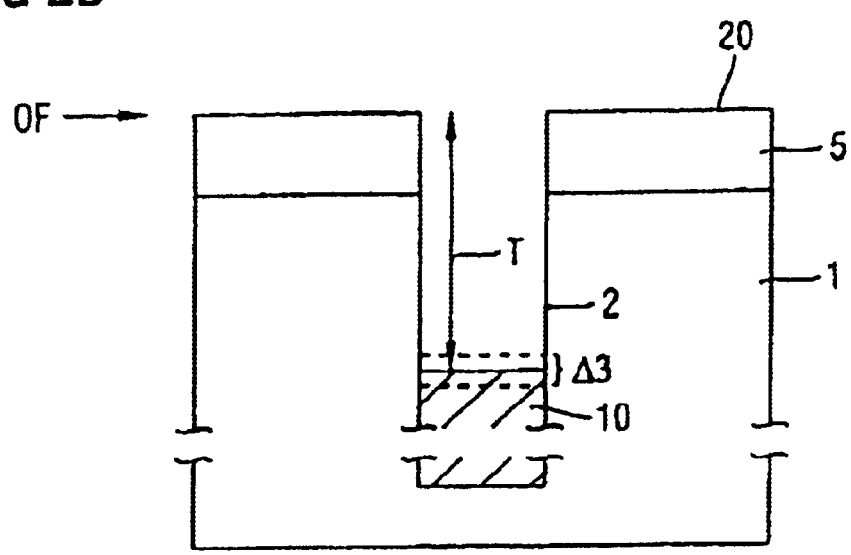

In accordance with what was stated above, in this embodiment of the method according to the invention, the final sinking depth T has a significantly smaller fluctuation range than the fluctuation range Δ3 already explained with reference to FIG. 2d.

Although the present invention has been described above on the basis of a preferred exemplary embodiment, it is not restricted thereto, but rather can be modified in diverse ways.

In particular, the selection of the mask and substrate materials [lacuna] the arrangement thereof are only by way of example and can be varied in many different ways.

Although an end point identification was used only for the first etching step in the above example, it can, of course, also be used for the further etching steps.

One example of an insignificant change to the etchant composition in the above example would be a slight shift in the $Cl/SF_6$ ratio whilst keeping the total flow constant in the range of up to 10%.

What is claimed is:

1. Fabrication method for a semiconductor structure having a partly filled trench, having the following steps:
   (a) provision of a semiconductor structure having a trench;
   (b) filling of the trench with a filling in such a way that the filling projects above a surface of the semiconductor structure by a first height, the filling covering the trench and the periphery of the trench;
   (c) planarization of the filling in a first etching step in such a way that the filling is essentially planar with the surface of the semiconductor structure;
   (d) sinking of the filling in the trench in a second etching step by a predetermined depth proceeding from the surface of the semiconductor structure;
   (e) essentially the same plasma power and the same etchant composition being used for the first and second etching steps; and
   (f) wherein a planarization of the filling is carried out in a zeroth etching step before the first etching step in such a way that the filling projects above the surface of the semiconductor structure by a second height, the filling covering the trench and the periphery of the trench, the zeroth etching step having a higher etching rate than the first etching step.

2. Method according to claim 1, wherein essentially the same etchant composition as for the first and second etching steps but an increased plasma power are used for the zeroth etching step.

3. Method according to claim 1, wherein at least the first etching step is carried out with a first time duration which is determined by an end point identification.

4. Method according to claim 1, wherein the zeroth etching step and the second etching step are carried out with a predetermined zeroth and second time duration.

5. Method according to claim 1, wherein the second etching step is carried out with a second time duration which is determined by an end point identification.

6. Method according to claim 1, wherein the semiconductor structure comprises a semiconductor substrate and a mask situated thereon, the mask being used for the etching of the trench.

7. Method according to claim 3, wherein the end point identification is carried out by interferometry.

8. Fabrication method for a semiconductor structure having a partly filled trench, having the following steps:
   (a) provision of a semiconductor structure having a trench;
   (b) filling of the trench with a filling in such a way that the filling projects above a surface of the semiconductor structure by a first height, the filling covering the trench and the periphery of the trench;
   (c) planarization of the filling in a first etching step in such a way that the filling is essentially planar with the surface of the semiconductor structure;
   (d) sinking of the filling in the trench in a second etching step by a predetermined depth proceeding from the surface of the semiconductor structure;
   (e) essentially the same plasma power and the same etchant composition being used for the first and second etching steps; and
   (f) wherein the etchant composition contains $SF_6$, Ar and $Cl_2$.

* * * * *